United States Patent [19]
Jones et al.

[11] Patent Number: 5,768,211
[45] Date of Patent: Jun. 16, 1998

[54] MULTI-PORT ARBITRATION FOR HIGH PERFORMANCE WIDTH EXPANSION

[75] Inventors: Christopher W. Jones, Pleasanton; Christopher L. Webb, San Jose, both of Calif.

[73] Assignee: Cypress Semiconductor Corporation, San Jose, Calif.

[21] Appl. No.: 688,904

[22] Filed: Jul. 31, 1996

[51] Int. Cl.$^6$ ..................................................... G11C 8/00
[52] U.S. Cl. .................. 365/230.05; 365/189.04; 365/195; 365/196
[58] Field of Search ............. 365/189.04, 230.05, 365/195, 196

[56] References Cited

U.S. PATENT DOCUMENTS

| | | | |
|---|---|---|---|
| 5,289,427 | 2/1994 | Nicholes et al. | 365/230.05 |
| 5,398,211 | 3/1995 | Willenz et al. | 365/230.05 |
| 5,459,851 | 10/1995 | Nakajima et al. | 395/476 |

OTHER PUBLICATIONS

"16K×8/9 Dual–Port Static RAM with Sem, Int, Busy", *Cypress Semiconductor Data Book*, pp. 6:1–17, May 1995.

"4K×16/18 and 8K×16/18 Dual–Port Static RAM with Sem, Int, Busy", *Cypress Semiconductor Data Book*, pp. 18–36, May 1995.

"1K×8 Dual–Port Static RAM", *Cypress Semiconductor Data Book*, pp. 6:37–49, May 1995.

"2K×8 Dual–Port Static RAM", *Cypress Semiconductor Data Book*, pp. 6:50–62, May 1995.

"2K×16 Dual–Port Static RAM", *Cypress Semiconductor Data Book*, pp. 6:63–73, May 1995.

"4K×8 Dual–Port Static RAMs and 4K×8 Dual–Port Static RAM with Semaphores", *Cypress Semiconductor Data Book*, pp. 6:74–86, May 1995.

"4K×8/9 Dual–Port Static RAM with Sem, Int, Busy", *Cypress Semiconductor Data Book*, pp. 6:87–102, May 1995.

"8K×8/9 Dual–Port Static RAM with Sem, Int, Busy", *Cypress Semiconductor Data Book*, pp. 6:103–120, May 1995.

*Primary Examiner*—David C. Nelms
*Assistant Examiner*—Hien Nguyen
*Attorney, Agent, or Firm*—Blakely, Sokoloff Taylor & Zafman LLP

[57] ABSTRACT

A multi-port memory device comprising a memory cell coupled to a first port and a second port. The second port receives write data for writing into the memory cell. The multi-port memory device further comprises an undo circuit coupled to the memory cell. The undo circuit invalidates the write data in response to receiving a busy signal. When the undo circuit invalidates the write data, the write data is not written into the memory cell. The busy signal indicates that the first port is enabled to access the memory cell at substantially the same time that the second port receives the write data. The busy signal may be generated by arbitration circuitry in the multi-port memory device or by arbitration circuitry in another device coupled to the multi-port memory device. For one embodiment, the busy signal may be generated by arbitration circuitry in a second multi-port memory device coupled in width expansion with the first multi-port memory device.

23 Claims, 7 Drawing Sheets

MULTI-PORT ARBITRATION FOR HIGH PERFORMANCE WIDTH EXPANSION

FIELD OF THE INVENTION

The present invention pertains to arbitration between multi-port devices. More particularly, the present invention relates to arbitration between multi-port memory devices coupled in width expansion.

DISCUSSION OF THE BACKGROUND

Conventional multi-port memory devices have a fixed number of data pins for coupling to a bi-directional data bus. When the data bus comprises more data lines than are available on a single multi-port memory device, two or more multi-port memory devices are coupled in width expansion to accommodate the wider data bus.

To accomplish width expansion with conventional multi-port memory devices, one device is designated as a master device, and the other devices are designated as slave devices. The master/slave designation may be accomplished through applying a voltage to a master/slave input pin on each of the multi-port memory devices, or by the manufacturer fabricating separate dedicated master and slave devices.

FIG. 1 shows a prior art system 100 including two dual-port random access memory devices (RAMs) configured as master 102 and slave 104 coupled in width expansion. Master 102 and slave 104 may each comprise, for example, 2K×8 dual-port RAMs configured in width expansion as a 2k×16 dual-port RAM.

A left port of system 100 comprises the left ports of master 102 and slave 104 which each are coupled to control signals CNTL (L), a write enable signal WE* (L), address signals ADDRESS (L), and a busy signal BUSY* (L). The control signals include chip enable and output enable signals. The write enable signal WE* (L) may alternatively be a read/write enable signal. Master 102 is also coupled to receive and generate low byte data LB DATA (L) for a left data bus, and slave 104 is coupled to receive and generate high byte data HB DATA (L) for the left data bus. Similarly, a right port of system 100 comprises the right ports of master 102 and slave 104 which are each coupled to control signals CNTL (R), a write enable signal WE* (R), address signals ADDRESS (R), and a busy signal BUSY* (R). Master 102 is also coupled to receive and generate low byte data LB DATA (R) for a right data bus, and slave 104 is coupled to receive and generate high byte data HB DATA (L) for the right data bus.

Master 102 and slave 104 each have a master/slave input pin M/S*. The M/S* input pin of master 102 is coupled to a logic one or positive voltage +V, configuring master 102 as a master device. The M/S* input pin of slave 104 is coupled to a logic zero or ground, configuring slave 104 as a slave device.

Arbitration is necessary when either the left port or the right port of system 100 attempts to write to a memory location in each of master 102 and slave 104 at the same time that the other port is accessing the same memory location. System 100 must arbitrate which side is allowed access to the memory location. Conventional width expanded multi-port memory systems, such as system 100, perform arbitration in master 102 only. The arbitration decision of master 102 is communicated to slave 104 via the busy signals BUSY* (L) and BUSY* (R). Master 102 outputs, and slave 104 receives, the busy signals BUSY* (L) and BUSY* (R).

For example, if master 102 decides that the left port should have access to a simultaneously addressed memory location, it outputs the BUSY* (R) signal having a low (active) logic state, and the BUSY* (L) signal having a high (inactive) logic state. Slave 104 waits until master 102 determines the states of BUSY* (L) and BUSY* (R) before determining which port may access the addressed memory location in slave 104.

It requires master 102 a certain amount of time to perform the arbitration function before BUSY* (L) and BUSY* (R) are generated. Thus, the write enable signals WE* (L) and WE* (R) must be delayed by delay circuits 24 and 26, respectively, before they are presented to slave 104. These delays are incurred for every write operation of both the left and right system ports, thus degrading system performance. For example, the delay required in a system using dual-port RAMs having a 25 nanoseconds write cycle time, may require up to 20 nanoseconds for master 102 to perform the arbitration function and generate BUSY* (L) and BUSY* (R), thus potentially pushing the actual write into slave 104 to a subsequent write cycle.

In some systems, there may be a low (or zero) frequency of address collisions. System designers can attempt to determine the frequency of address collisions and undertake a risk calculus to determine whether delay circuits 24 and 26 should be employed.

What is needed are a method and apparatus for width expanding multi-port memory devices without incurring the performance degradation of performing arbitration in only one device and then passing the arbitration information to subsequent devices.

What is also needed are multi-port memory devices that may be coupled together in width expansion without designating one of the devices as a master device and the other devices as slave devices.

Additionally, what is needed are multi-port memory devices that may be coupled together in width expansion without requiring a master/slave input pin on the devices.

SUMMARY AND OBJECTS OF THE INVENTION

The present invention concerns a multi-port memory device comprising a memory cell coupled to a first port and a second port. The second port receives write data for writing into the memory cell. The multi-port memory device further comprises an undo circuit coupled to the memory cell. The undo circuit invalidates the write data in response to receiving a busy signal. When the undo circuit invalidates the write data, the write data is not written into the memory cell. The busy signal indicates that the first port is enabled to access the memory cell at substantially the same time that the second port receives the write data. The busy signal may be generated by arbitration circuitry in the multi-port memory device or by arbitration circuitry in another device coupled to the multi-port memory device. For one embodiment, the busy signal may be generated by arbitration circuitry in a second multi-port memory device coupled in width expansion with the first multi-port memory device.

Other objects, features, and advantages of the present invention will be apparent from the accompanying drawings and from the detailed description that follows.

BRIEF DESCRIPTION OF THE DRAWINGS

The present invention is illustrated by way of non-limiting examples in the figures of the accompanying drawings, in which like references indicate similar elements and in which.

DETAILED DESCRIPTION

A method and apparatus for arbitration between multi-port memory devices coupled in width expansion are described. Each multi-port memory device performs arbitration and communicates its individual arbitration decision via a busy I/O pin to each of the other multi-port memory devices coupled to a common busy signal line. No extra pins are required to designate master and slave devices, nor are delay circuits required to delay write control signals to one device while another device performs arbitration for the system. The embodiments described herein may be extended to multi-port devices having any number of ports and to multi-port devices width expanded to accommodate any data bus width. The embodiments described herein may operate synchronously or asynchronously.

Alternatively, the embodiments described herein may be extended to a system having at least one multi-port memory device coupled to any other type of device, including another type of memory device (e.g. single port, PROM, etc.), controller device, or other logic device. Each of the devices in the system would still be coupled to a common busy signal line, and the multi-port memory device may include the embodiments illustrated in FIGS. 2–7 described below.

Figure 1:
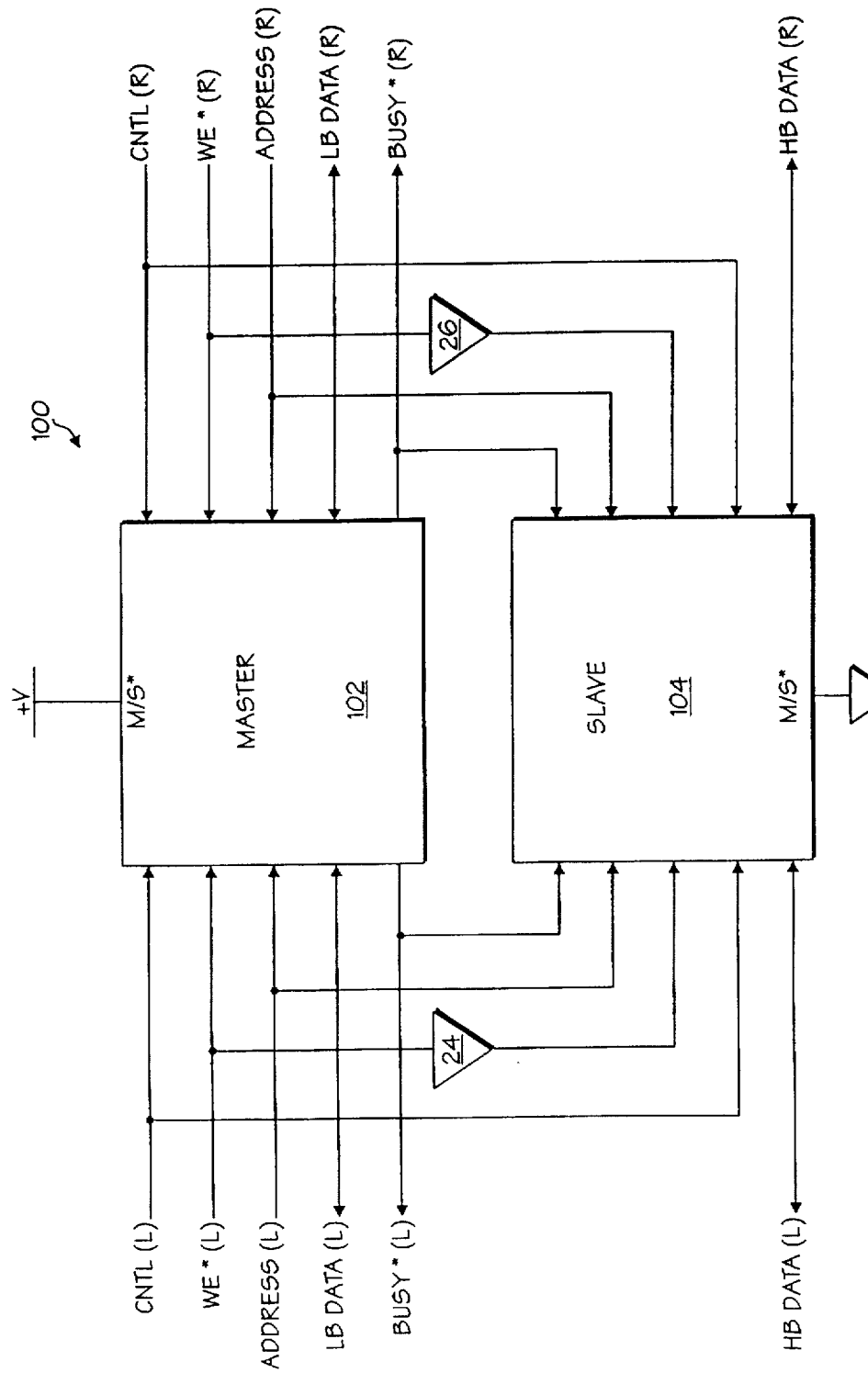
FIG. 1 is a prior art block diagram of two dual-port RAMs coupled in width expansion.
Figure 2:
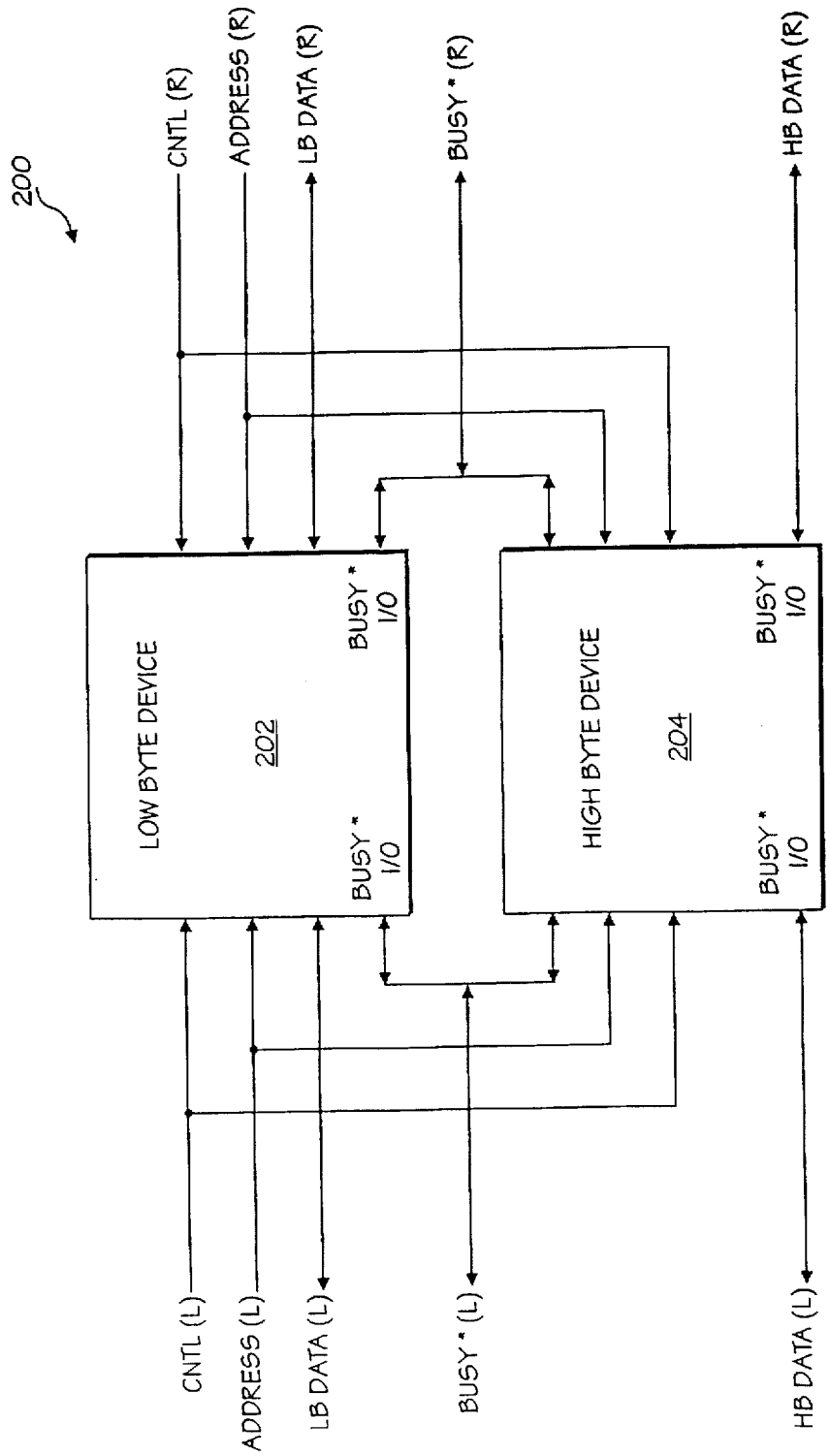
FIG. 2 is a block diagram of one embodiment of two dual-port RAMs coupled in width expansion according to the present invention.

FIG. 2 shows an exemplary dual-port system 200 comprising low byte device 202 and high byte device 204 coupled in width expansion. Low byte device 202 and high byte device 204 may comprise RAMs or other types of multi-port memory. Low byte device 202 and high byte device 204 may each comprise identical devices.

A left port of system 200 comprises the left ports of low byte device 202 and high byte device 204 which each are coupled to control signals CNTL (L), address signals ADDRESS (L), and a busy signal BUSY* (L). An asterisk symbol "*" is used throughout this application to refer to an active low signal. The control signals include write enable, read/write enable, chip enable, and/or output enable signals. Similarly, a right port of system 200 comprises the right ports of low byte device 202 and high byte device 204 which are coupled to control signals CNTL (R), address signals ADDRESS (R), and a busy signal BUSY* (R).

Low byte device 202 also receives and generates low byte data LB DATA (L) for a left data bus, and high byte device 204 receives and generates high byte data HB DATA (L) for the left data bus. Low byte device 202 additionally receives and generates low byte data LB DATA (R) for a right data bus, and high byte device 204 receives and generates high byte data HB DATA (R) for the right data bus.

One of ordinary skill in the art will appreciate that low byte device 202 may alternatively receive and generate high byte data for the right or left data bus, and high byte device 204 may alternatively receive and generate low byte data for the right or left data bus.

While only two dual-port memory devices are illustrated in width expansion in FIG. 2, any number of memory devices may be coupled in width expansion according to the present invention.

Low byte device 202 and high byte device 204 each include arbitration circuits that operate simultaneously to compute their own address arbitration. Thus, when one port attempts to write to memory locations having the same address in both the low byte device 202 and high byte device 204 at substantially the same time that the other port is attempting to write to or read from the same memory locations, both low byte device 202 and high byte device 204 arbitrate which port will gain access to the memory locations.

Low byte device 202 and high byte device 204 each have BUSY I/O pins for their respective left and right ports. The BUSY I/O pins output and receive the BUSY* (L) an BUSY* (R) signals. Each device asserts either BUSY* (L) or BUSY* (R) on one of its own BUSY I/O pins to a low logic state (active) when it wishes to deny the respective port access to a particular memory address. Each device also simultaneously and continuously monitors the BUSY* (L) and BUSY* (R) signals to determine if the other device has determined that one port should be denied access to a particular memory location.

For one embodiment, each BUSY I/O pin has an input receiver circuit for monitoring the BUSY* (L) and BUSY* (R), and an output driver circuit coupled to the common BUSY* (L) and BUSY* (R) signals. For one embodiment, the output circuit comprises an open-drain or open-collector output circuit which pulls the BUSY* (L) or BUSY* (R) signals to a low logic state for all devices when one device pulls BUSY* (L) or BUSY* (R) low.

If both low byte device 202 and high byte device 204 each always arrived at the same arbitration decision, then nothing more would be needed. However, due to device and system parameters including device-to-device temperature, voltage, speed and process variations, and system layout variations, each device may not arrive at the same arbitration decision.

If the two devices arbitrate differently, then one device may write data into one port while the other device does not, resulting in coherency problems. Given that each device knows the result of its own arbitration decision, each device decides whether it needs to invalidate or "undo" the last write operation if any device has asserted BUSY* (L) or BUSY *(R) low. Low byte device 202 and high byte device 204 may each also include additional logic to undo or invalidate a write operation to one device if the other (or both) device asserts one of the busy signals BUSY* (L) or BUSY* (R).

Figure 3:
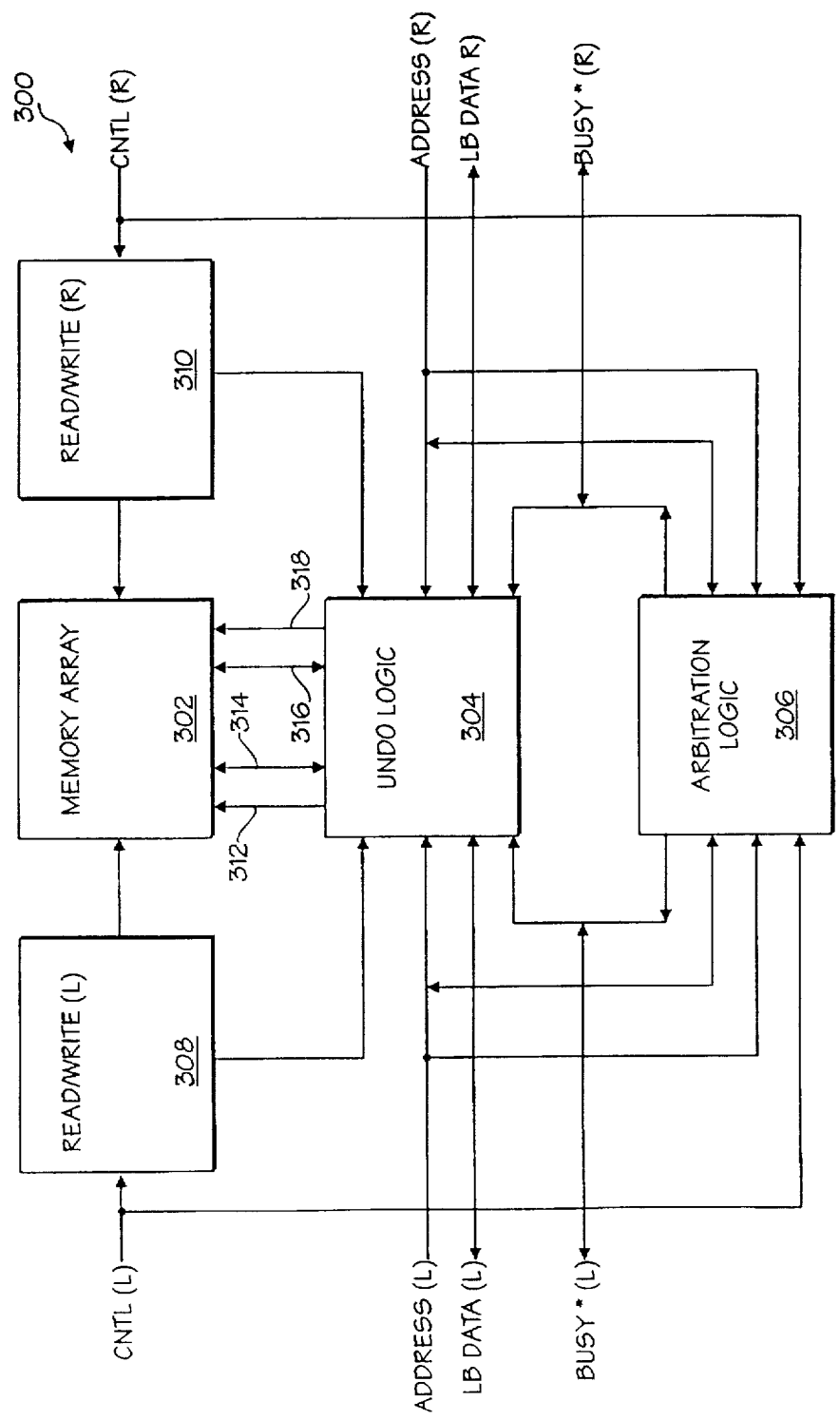
FIG. 3 is a block diagram of one embodiment of a dual-port RAM having undo logic according to the present invention.

FIG. 3 illustrates a dual-port memory device 300 that is one embodiment of low byte data device 202 which supports an undo or invalidation function. Dual-port memory device 300 may also comprise one embodiment of high byte data device 204.

Dual-port memory device 300 includes memory array 302 coupled to read/write circuits read/write (L) 308 and read/write (R) 310, and undo logic 304. Memory array 302 includes at least one addressable multi-port memory cell for storing data supplied by either the left or right ports of dual-port memory device 300. Alternatively, memory array 302 includes a single-port memory cell and multiplex and/or de-multiplex circuitry for simulating multi-port memory cell operation.

Read/write (L) 308 and read/write (R) 310 are read/write circuits which receive control signals CNTL (L) and CNTL (R), respectively, and enable data to be written into and read from memory array 302.

Read/write (L) 308 and read/write (R) 310 are also coupled to undo logic 304. Undo logic 304 additionally receives address signals ADDRESS (L) and ADDRESS (R), low byte data LB DATA (L) and LB DATA (R), and busy signals BUSY* (L) and BUSY* (R).

Control signals CNTL (L) and CNTL (R), address signals ADDRESS (L) and ADDRESS (R), low byte data LB DATA (L), and LB DATA (R) are additionally provided to arbitration logic 306. Arbitration logic 306 outputs busy signals BUSY*(L) and BUSY* (R). When either the left port or the right port of dual-port memory device 300 attempts to write to a memory location in memory array 302 at the same time the other port accesses the same memory location, arbitration logic 306 arbitrates which port is allowed access to the memory location. Arbitration logic 306 asserts the BUSY* (L) or BUSY* (R) signal low for the port that is not allowed to access the memory location.

In operation, write data for a particular memory location is written to undo logic 304 from the left or right port of dual-port memory device 300. Undo logic 304 temporarily stores or stages the write data for a sufficient length of time to ensure that arbitration logic 306 has not asserted one of the busy signals low, or that any other device coupled in width expansion with dual-port memory device 300 has not asserted one of the busy signals low in response to the write operation. A system utilizing dual-port memory device 300 coupled in width expansion with other dual-port memory devices, interprets the pending write operation as a completed write operation if BUSY* (L) or BUSY* (R) remains high.

The pending write operation remains valid and is written into memory array 302 after the sufficient length of time has passed. Thus, after the sufficient length of time has passed, undo logic 304 transmits the address signals ADDRESS (L) and/or ADDRESS (R) on lines 312 and 318, respectively, along with the write data on lines 314 and/or 316, respectively, to memory array 302. For one embodiment, the sufficient length of time is the time until the next write data is written into undo logic 304.

For one embodiment, undo logic 304 comprises a write pipeline for each of the left and right ports, and stores or stages the write data in the appropriate write pipeline. For this embodiment, the pending write data will be written into memory array 302 when it has been shifted through each stage of the appropriate write pipeline.

Undo logic 304 monitors the busy signals BUSY* (L) and BUSY* (R). If one of the busy signals has been asserted (low) before the sufficient amount of time after a write operation has passed, the write data stored in undo logic 304 is "undone" or invalidated. When the write data is undone or invalidated, it is not written into memory array 302. A system may monitor BUSY* (L) and BUSY* (R) and determine whether to rewrite the data to dual-port memory device 300.

For one embodiment, the write data is invalidated by associating a mask or valid bit with each pending write data. Undo logic 304 sets the mask or valid bit when the pending write data is invalidated, and resets the mask or valid bit when new write data is written into undo logic 304. The mask or valid bit may alternatively be reset at a different time.

When a read occurs from either the left port or the right port, the read data may be stored in temporary storage for the left port in undo logic 304, temporary storage for the right port in undo logic 304, or in memory array 302. Undo logic 304 supports reading the data from any of these three locations.

Figure 4:
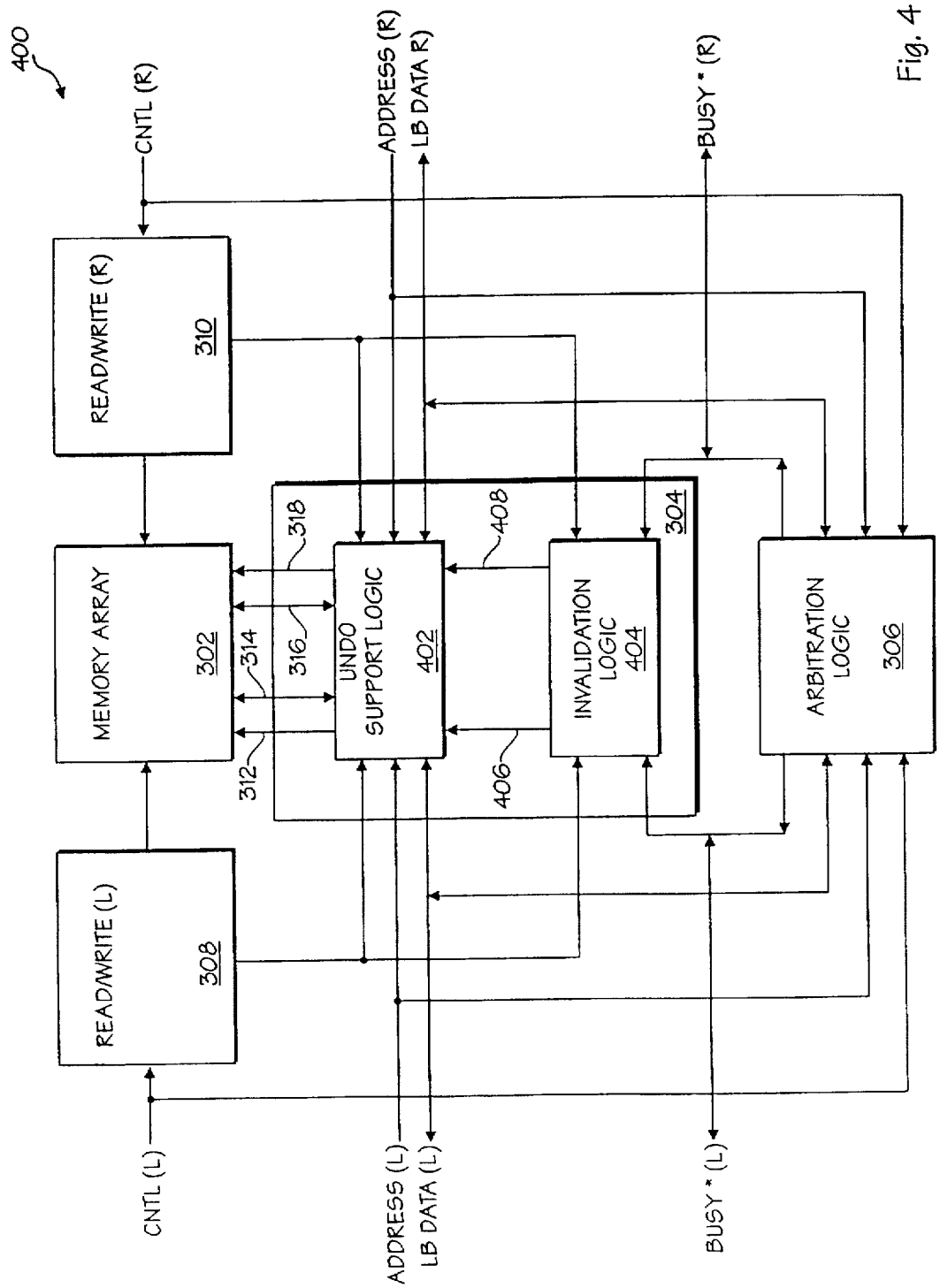
FIG. 4 is a block diagram of one embodiment of the undo logic shown in FIG. 3 including undo support logic and invalidation logic.

FIG. 4 illustrates undo logic 400 which is one embodiment for undo logic 304. Undo logic 400 comprises undo support logic 402 coupled to invalidation logic 404 via lines 406 and 408. Undo support logic 402 is coupled to read/write circuits 308 and 310, ADDRESS (L), ADDRESS (R), LB DATA (L), and LB DATA (R). Undo support logic 402 additionally couples address signals ADDRESS (L) and ADDRESS (R) to memory array 302 via lines 312 and 318, respectively, and communicates left and right port data to and from memory array 302 via lines 314 and 316, respectively. Undo support logic 402 may comprise undo support logic for the left port and undo support logic for the right port.

Invalidation logic 404 is coupled to read/write circuits 308 and 310, and receives busy signals BUSY* (L) and BUSY* (R) from arbitration logic 306 or from other memory devices coupled in width expansion with dual-port memory device 300. Invalidation logic 404 may comprise invalidation logic for the left port and invalidation logic for the right port. For an alternative embodiment, invalidation logic 404 may be located outside of dual-port memory device 300.

Undo support logic 402 temporarily stores or stages write data from the left or right ports of dual-port memory device 300 for a sufficient length of time to ensure that arbitration logic 306 has not asserted one of the busy signals, or that any other device coupled in width expansion with dual-port memory device 300 has not asserted one of the busy signals BUSY* (L) or BUSY* (R) in response to a write function. The pending write data remains valid and is written into memory array 302 after the sufficient length of time has passed.

For one embodiment, undo support logic 402 comprises a write pipeline for each of the left and right ports, and stores or stages the write data in the appropriate write pipeline. For this embodiment, pending write data will be written into memory array 302 when it has been shifted through each stage of the appropriate write pipeline.

Invalidation logic 404 monitors the busy signals BUSY* (L) and BUSY* (R). If one of the busy signals has been asserted (low) before the sufficient amount of time after a write operation has passed, the write data stored in undo support logic 402 is undone or invalidated.

Invalidation logic 404 invalidates the write data for the left port of dual-port memory device 300 by sending a signal on line 406 to the undo support logic 402. Invalidation logic 404 invalidates the write data for the right port of dual-port memory device 300 by sending a signal on line 408 to the undo support logic 402. For one embodiment, the write data is invalidated by associating a mask or valid bit with each pending write data. Invalidation logic 404 sets the mask or valid bit by sending a set signal on line 406 and/or line 408 to undo support logic 402 when the write data is invalidated. Invalidation logic 404 resets the mask or valid bit by sending a reset signal on line 406 and/or line 408 to undo support logic 402 when new write data is written into undo support logic 402. The mask or valid bit may alternatively be reset at a different time.

When a read occurs from either the left port or the right port, the read data may be stored in temporary storage for the left port in undo support logic 402, temporary storage for the right port in undo support logic 402, or in memory array 302. Undo support logic 402 supports reading the data from any of these three locations.

Figure 5:
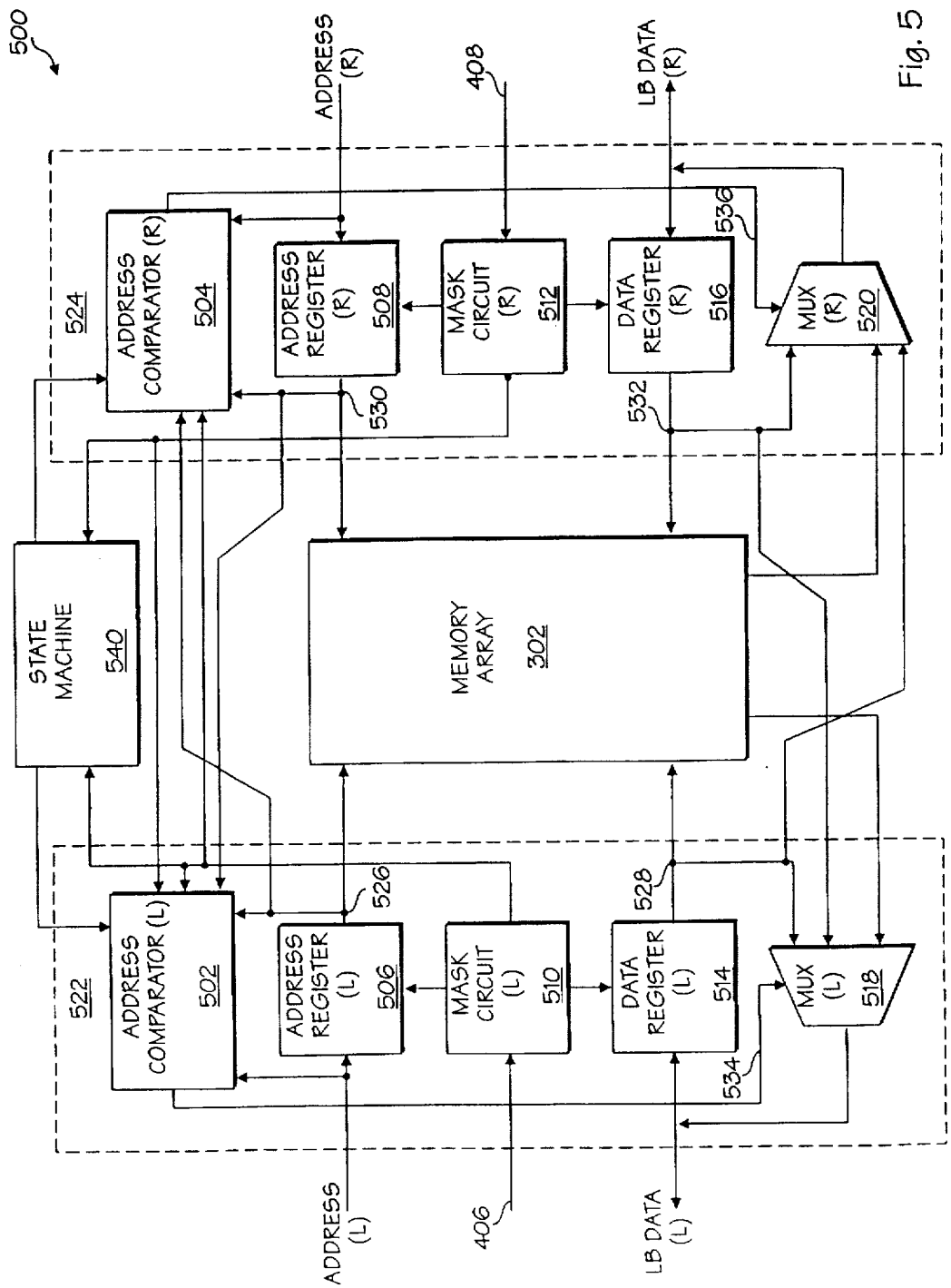
FIG. 5 is a block diagram of one embodiment of the undo support logic shown in FIG. 4.

FIG. 5 illustrates undo support logic 500 which is one embodiment for undo support logic 402 illustrated in FIG. 4. Undo support logic 500 comprises undo support logic 522 for the left port coupled to memory array 302, and undo support logic 524 for the right port 524 coupled to memory array 302.

Undo support logic 522 includes a left port write pipeline storing or staging address and associated write data. The left port write pipeline comprises address register (L) 506 and data register (L) 514. Address register (L) 506 has an input that receives ADDRESS (L), and an output that couples ADDRESS (L) to memory array 302 via line 526. Data register (L) 514 has an input that receives LB DATA (L), and an output that couples LB DATA (L) to memory array 302 via line 528. Similarly, undo support logic 524 includes a right port write pipeline storing or staging address and associated write data. The right port write pipeline comprises address register (R) 508 and data register (R) 516. Address register (R) 508 has an input that receives ADDRESS (R), and an output that couples ADDRESS (R) to memory array 302 via line 530. Data register (R) 516 has an input that receives LB DATA (R), and an output that couples LB DATA (R) to memory array 302 via line 532. The left port and right port write pipelines may comprise one storage location or any number of storage locations.

Undo support logic 522 also includes a mask circuit (L) 510 receiving the set and reset signals from invalidation logic 404 via line 406, and optionally coupled to address register (L) 506 and data register (L) 514. Similarly, undo support logic 524 also includes a mask circuit (R) 512 receiving the set and reset signals from invalidation logic 404 via line 408, and optionally coupled to address register (R) 508 and data register (R) 516.

Mask circuit (L) 510 and mask circuit (R) 512 validate or invalidate the pending write data and associated address information in the left port and right port write pipelines, respectively. For one embodiment, each of the mask circuits comprises a mask register associated with each of the pending address and associated write data in the left and right port write pipelines. For example, mask register 510 is set (invalidated or undone) by a set signal on line 406, and is reset (validated) by a reset signal on line 406. If the mask registers are set, then the pending write data will not be written into memory array 302.

Alternatively, each of the mask circuits may comprise a plurality of mask bits associated with a plurality of pending writes in the left and right port write pipelines.

Undo support logic 522 further includes read circuitry comprising address comparator (L) 502, multiplexer (L) 518, and state machine 540. The read circuitry provides a means for the left port of dual-port memory device 300 to read addressed data from the left port write pipeline, the right port write pipeline, or memory array 302. Address comparator (L) 502 receives ADDRESS (L) from the input of address register (L) 506, ADDRESS (L) from the output of address register (L) 506, and ADDRESS (R) from the output of address register (R) 508. Address comparator (L) 502 is additionally coupled to mask circuit (L) 510 and mask circuit (R) 512. Multiplexer (L) 518 is a three-to-one multiplexer that, in response to select signals from address comparator (L) 502 on line 534, outputs as LB DATA (L) either LB DATA (L) from data register (L) 514 on line 528, LB DATA (R) from data register (R) 516 on line 532, or data from an addressed memory cell in memory array 302.

Similarly, undo support logic 524 further includes read circuitry comprising address comparator (R) 504, multiplexer (R) 520, and state machine 540. The read circuitry provides a means for the right port of dual-port memory device 300 to read addressed data from the left port write pipeline, the right port write pipeline, or memory array 302. Address comparator (R) 504 receives ADDRESS (R) from the input of address register (R) 508, ADDRESS (R) from the output of address register (R) 508, and ADDRESS (L) from the output of address register (L) 506. Address comparator (R) 504 is additionally coupled to mask circuit (L) 510 and mask circuit (R) 512. Like multiplexer (L) 518, multiplexer (R) 520 is a three-to-one multiplexer that, in response to select signals from address comparator (R) 504 on line 536, outputs as LB DATA (R) either LB DATA (R) from data register (R) 516 from line 532, LB DATA (L) from data register (L) 514 on line 528, or data from an addressed memory cell in memory array 302.

State machine 540 is coupled to address comparator (L) 502, address comparator (R) 504, mask circuit (L) 510, and mask circuit (R) 512. State machine 540 receives mask circuit information from mask circuit (L) 510 and from mask circuit (R) 512. State machine 540 interprets this mask information to help determine the last write operation that has not been invalidated. This can be accomplished with a single register with two states such that one state indicates that the left port has the last write operation that has not been invalidated while the other state indicates that the right port has the last write operation that has not been invalidated. If the left or right port write pipelines have more than one stage, then additional corresponding register elements may be incorporated into state machine 540.

When a write operation is performed on the left port, mask circuit (L) 510 will be reset, and state machine 540 is changed to point to the left port upon the resetting of mask circuit (L) 510. If the pipelined write operation for the left port is later invalidated, mask circuit (L) 510 will be set, and state machine 540 is changed to point to the right port upon the setting of mask circuit (L) 510. If the pipelined write of the right port is not valid, having state machine 540 point to the right port does not create a problem since mask circuit (R) 512 indicates that the pipelined write of the right port is invalid.

When a write operation is performed on the right port, mask circuit (R) 512 will be reset, and state machine 540 is changed to point to the right port upon the resetting of mask circuit (R) 512. If the pipelined write operation for the right port is later invalidated, mask circuit (R) 512 will be set, and state machine 540 is changed to point to the left port upon the setting of mask circuit (R) 512. If the pipelined write of the left port is not valid, having state machine 540 point to the left port does not create a problem since mask circuit (L) 510 indicates that the pipelined write of the left port is invalid.

In operation, when a system desires to read data via the left port of dual-port memory device 300, the address is provided on the address signals ADDRESS (L). Address comparator (L) 502 compares the address on ADDRESS (L) with the address in the left port write pipeline at line 526 and the address in the right port write pipeline at line 530, and also interprets the mask information from mask circuits 510 and 512 and the most recent write operation information from state machine 540. If the address on ADDRESS (L) matches the address in the left port write pipeline on line 526 and the mask bit from mask circuit (L) 510 indicates a valid write, a select signal is provided on line 534 to enable the pending write data in data register (L) 514 to be output as LB DATA (L) via multiplexer 518. If the address on ADDRESS (L) matches the address in the right port write pipeline on line 530 and the mask bit from mask circuit (R) 512 indicates a valid write, another select signal is provided on line 534 to enable the pending write data in data register (R) 516 to be output as LB DATA (L) via multiplexer 518. If the address on ADDRESS (L) matches both the address in the left port write pipeline on line 526 while the mask bit from mask circuit (L) 510 indicates a valid write and the address in the right port write pipeline on line 530 while the mask bit from mask circuit (R) 512 indicates a valid write, then the information from state machine 540 indicating which port completed the most recent write operation that has not been invalidated enables the appropriate select signal that is provided on line 534 to enable the pending write data in one of data register (L) 514 or data register (R) 516 to be output as LB DATA (L) via multiplexer 518. Finally, if the address on ADDRESS (L) does not match the address in the left or right port write pipelines, or if a matched address does not have a valid write operation as indicated by the mask circuits, the address is provided to memory array 302 and yet another select signal is provided on line 534 to enable data from memory array 302 to be output as LB DATA (L) via multiplexer 518.

Similarly, when a system desires to read data via the right port of dual-port memory device 300, the address is provided on the address signals ADDRESS (R). Address comparator (R) 504 compares the address on ADDRESS (R) with the address in the left port write pipeline at line 526 and the address in the right port write pipeline at line 530, and also interprets the mask information from mask circuits 510 and 512 and the most recent write operation information from state machine 540. If the address on ADDRESS (R) matches the address in the left port write pipeline on line 526 and the mask bit from mask circuit (L) 510 indicates a valid write, a select signal is provided on line 536 to enable the pending write data in data register (L) 514 to be output as LB DATA (R) via multiplexer 520. If the address on ADDRESS (R) matches the address in the right port write pipeline on line 530 and the mask bit from mask circuit (R) 512 indicates a valid write, another select signal is provided on line 536 to enable the pending write data in data register (R) 516 to be output as LB DATA (R) via multiplexer 520. If the address on ADDRESS (R) matches both the address in the left port write pipeline on line 526 while the mask bit from mask circuit (L) 510 indicates a valid write and the address in the right port write pipeline on line 530 while the mask bit from mask circuit (R) 512 indicates a valid write, then the information from state machine 540 indicating which port completed the most recent write operation that has not been invalidated enables the appropriate select signal that is provided on line 536 to enable the pending write data in one of data register (L) 514 or data register (R) 516 to be output as LB DATA (R) via multiplexer 520. Finally, if the address on ADDRESS (R) does not match the address in the left or right port write pipelines, or if a matched address does not have a valid write operation as indicated by the mask circuits, the address is provided to memory array 302 and yet another select signal is provided on line 536 to enable data from memory array 302 to be output as LB DATA (R) via multiplexer 520.

The operation of undo support logic 500 is summarized in Table 1.

TABLE 1

| ADDRESS (L) Match | Mask (L) | ADDRESS (R) Match | Mask (R) | Data Selection |
|---|---|---|---|---|
| Yes | Valid Data | Yes | Valid Data | Depends on State Machine |
| Yes | Valid Data | Yes | Invalid Data | Data (L) |
| Yes | Invalid Data | Yes | Valid Data | Data (R) |
| Yes | Invalid Data | Yes | Invalid Data | Memory Data |
| Yes | Valid Data | No | X | Data (L) |
| Yes | Invalid Data | No | X | Memory Data |
| No | X | Yes | Valid Data | Data (R) |
| No | X | Yes | Invalid Data | Memory Data |
| No | X | No | X | Memory Data |

Figure 6:
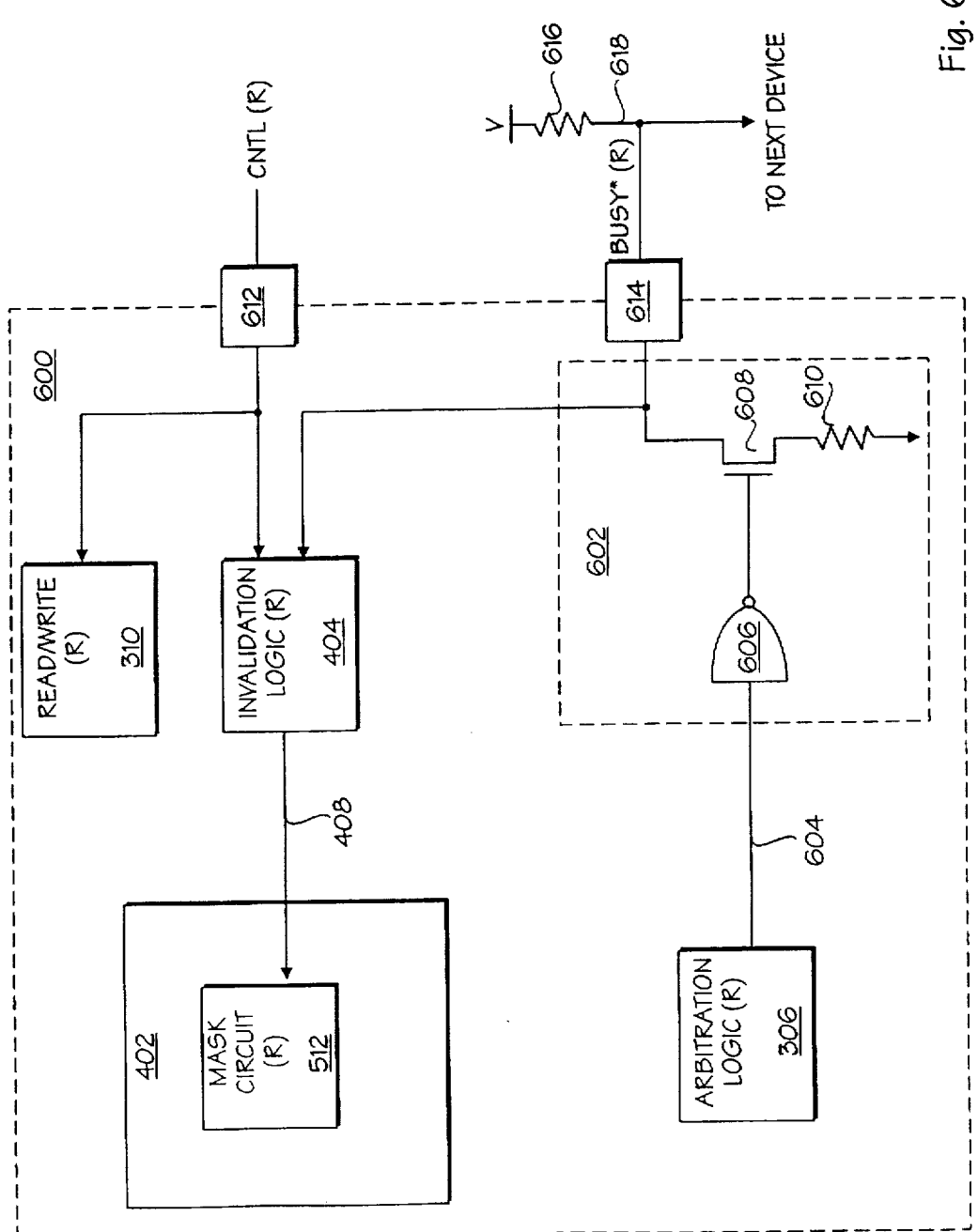
FIG. 6 is a circuit diagram of one embodiment of a BUSY I/O pin of the present invention.

FIG. 6 shows one embodiment of a dual-port memory device 600 having a busy I/O pin 614 coupled to a common busy line 618. Dual-port memory device 600 is one embodiment of how a multi-port memory device can generate and monitor a busy signal through a busy I/O pin to support the arbitration and undo or invalidation functions described with respect to FIGS. 2–5 discussed above. For clarity of explanation, only arbitration of the right port logic in one multi-port memory device is illustrated in FIG. 6. Furthermore, dual-port memory device 600 is coupled in width expansion with other multi-port memory devices each having similar circuit components and a busy I/O pin coupled to common busy line 618.

Dual-port memory device 600 includes arbitration logic 306 coupled to output driver circuit 602 comprising inverter 606 and transistor 608. Transistor 608 has its drain coupled to busy I/O pin 614 and common busy line 618 in an open-drain configuration. Transistor 608 also has its source coupled to ground via optional resistor 610. It will be appreciated that other output driver circuits may be used for output driver circuitry 602. It will be appreciated that output circuitry 602 may be included within arbitration logic 306.

When arbitration logic 306 determines that the left port should have priority to a simultaneously accessed memory location over the right port, arbitration logic 306 asserts a signal having a low logic state on line 604. Inverter 606 drives a high logic state onto the gate of transistor 608 in response to the low logic state on line 604. The high logic state on the gate of transistor 608 causes dual-port memory device 600 to drive BUSY* (R) to a low logic state (active) on busy I/O pin 614 and consequently pull common busy line 618 to a low logic state. Every multi-port memory device coupled in width expansion with dual-port memory device senses that the common busy line 618 has been pulled low, and proceeds to determine if pending write data should be invalidated. As illustrated in FIG. 6, the common busy line 618 is pulled up to a positive voltage V by resistor 616.

In an alternative embodiment, when arbitration logic 306 determines that the left port should have priority to a simultaneously accessed memory location over the right port, arbitration logic 306 asserts a signal having a high logic state on line 604. The high logic state is then directly coupled to the gate of transistor 608 without the use of inverter 606.

Invalidation logic (R) 404 receives BUSY* (R) from busy I/O pin 614, control signals CNTL (R) from pins 612, and read/write signals from read/write (R) 310. When BUSY* (R) is driven to a low logic state by dual-port memory 600, or by another multi-port memory device coupled in width expansion with dual-port memory device 600, invalidation logic (R) 404 and undo support logic 402 invalidate pending write data temporarily stored in undo support logic 402.

Figure 7:
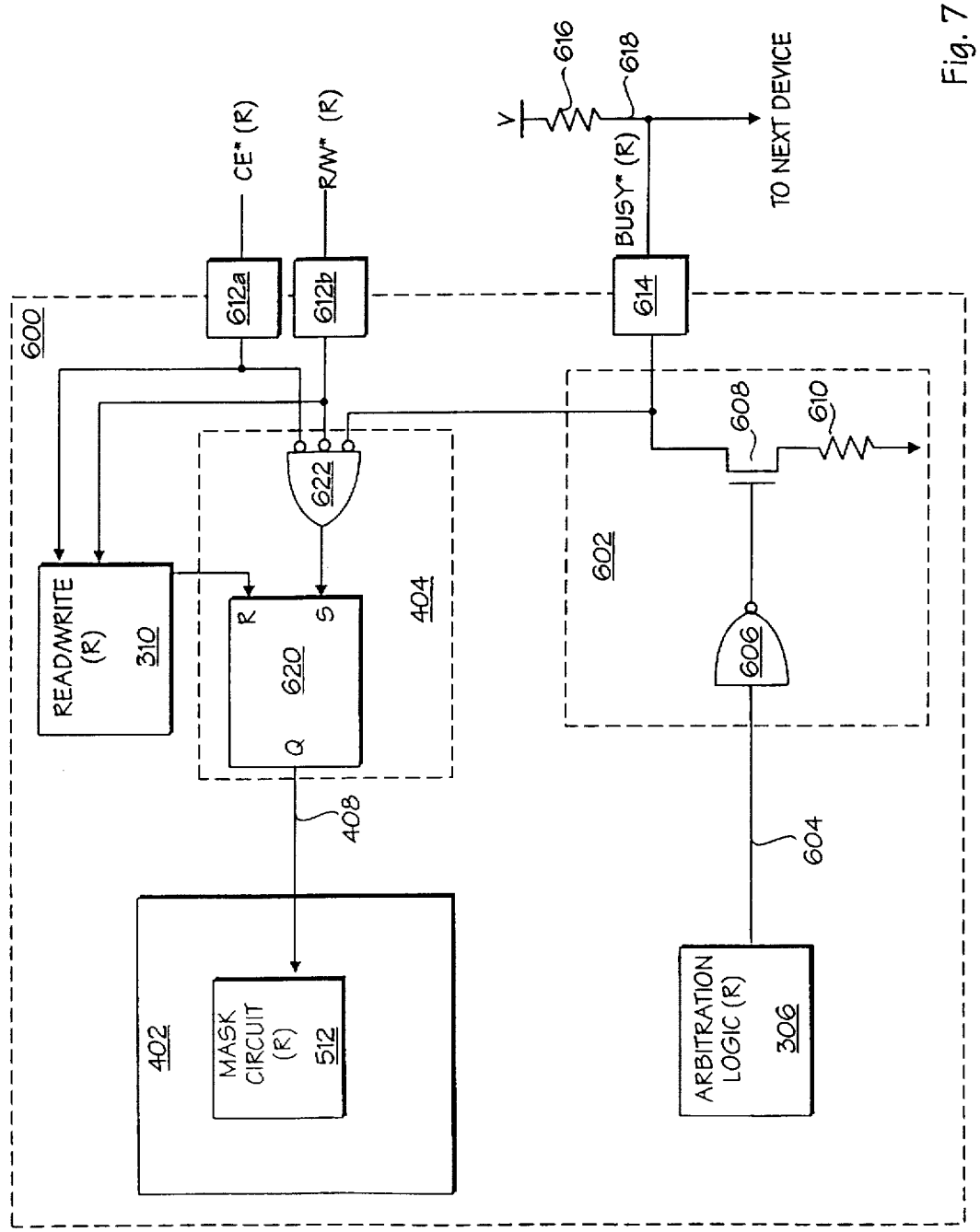
FIG. 7 is a circuit diagram of one embodiment of the invalidation logic shown in FIG. 6.

FIG. 7 shows one embodiment of invalidation logic 404 illustrated in FIG. 6. Invalidation logic 404 includes AND gate 622 and SR register 620. The control signals CNTL (L) comprise a chip enable signal CE* (R) coupled to pin 612a, and a read/write signal R/W* (R) coupled to pin 612b. AND gate 622 has three active low inputs: the first active low input is coupled to CE* (R) and pin 612a; the second active low input is coupled to R/W* (R) and pin 612b; and the third active low input is coupled to BUSY* (R) and busy I/O pin 614.

When dual-port memory device 600 is enabled (CE* (R) low) and receiving write data (R/W* (R) low), AND gate 622 will couple a signal having a high logic state to the set input S of SR register 620 if BUSY*(R) is low (active). This will cause the output Q of SR register to provide a set signal on line 408 having a high logic state to mask circuit (R) 512. The set signal on line 408 indicates that the pending write data should be invalidated. When the next write data is provided to dual-port memory device 600, read/write (R) 310 couples a signal having a high logic state to the reset input R of SR register 620. This will cause the output Q of SR register 620 to output a reset signal on line 408 having a low logic state to mask circuit (R) 512. The reset signal on line 408 indicates that the new pending write data is valid write data.

One of ordinary skill in the art will appreciate that the set and reset functions of SR register 620 may be reversed. Furthermore, many other embodiments of invalidation logic 404 may be used within the spirit and scope of the present invention.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A multi-port memory device comprising:

a first port;

a second port receiving write data;

a memory cell coupled to the first port and the second port; and an undo circuit coupled to the memory cell, the undo circuit invalidating the write data in response to a busy signal, wherein when the write data is invalidated, the write data is not written into the memory cell.

2. The multi-port memory device of claim 1, wherein the busy signal indicates that the first port is enabled to access the memory cell at substantially the same time that the second port receives the write data.

3. The multi-port memory device of claim 1, further comprising an arbitration circuit coupled to the first port and the second port, the arbitration circuit configured to generate the busy signal.

4. The multi-port memory device of claim 3, further comprising:

an undo support circuit coupled to the memory cell; and wherein the undo circuit further comprises an invalidation circuit coupled to the second port and the undo support circuit, the invalidation circuit coupling a first signal to the undo support circuit in response to the busy signal, and coupling a second signal to the undo support circuit when the second port receives valid write data.

5. The multi-port memory device of claim 4, wherein the undo support circuit further comprises:

a write pipeline receiving and staging the write data until the write data is to be written into the memory cell, or until the write data is invalidated.

6. The multi-port memory device of claim 5, wherein the undo support circuit indicates whether the write data in the write pipeline is to be written into the memory cell or is invalid.

7. The multi-port memory device of claim 1, further comprising:

a first undo support circuit coupled to the first port and the memory cell; and a second undo support circuit coupled to the second port and the memory cell.

8. The multi-port memory device of claim 7, wherein:

the first undo support circuit comprises a first write pipeline coupled to the first port and the memory cell; and the second undo support circuit comprises a second write pipeline coupled to the second port and the memory cell.

9. The multi-port memory device of claim 8, wherein:

the first undo support circuit further comprises a first read circuit coupled to the first write pipeline and the second write pipeline, the first read circuit enabling the first port to output data from the memory cell, the first write pipeline, or the second write pipeline; and the second undo support circuit further comprises a second read circuit coupled to the second write pipeline and the first write pipeline, the second read circuit enabling the second port to output data from the memory cell, the first write pipeline, or the second write pipeline.

10. The multi-port memory device of claim 7, wherein:

the first undo support circuit comprises a first mask circuit; and a first invalidation circuit coupled to the first port and the first mask circuit, the first invalidation circuit coupling a first signal to the first mask circuit in response to the busy signal, and coupling a second signal to the first mask circuit in response to valid write data.

11. The multi-port memory device of claim 10, wherein:

the second undo support circuit comprises a second mask circuit; and a second invalidation circuit coupled to the second port and the second mask circuit, the second invalidation circuit coupling a third signal to the second mask circuit in response to the busy signal, and coupling a fourth signal to the second mask circuit in response to valid write data.

12. A system comprising:

a first device comprising the multi-port memory device of claim 1; and a second device coupled to the first device.

13. The system of claim 12, wherein:

the first device comprises a first circuit coupled to the first port and the second port of the first device, the first circuit configured to generate the busy signal; and the second device comprises a second circuit configured to generate another busy signal.

14. The system of claim 13, wherein the busy signals may be generated at substantially the same time.

15. The system of claim 13, wherein if either of the busy signals are generated, then:

the undo circuit of the first device invalidates the write data received by the second port of the first device.

16. The system of claim 15, wherein:

when the write data received by the first device is invalidated, the write data is not written into the memory cell of the first device.

17. The system of claim 12, wherein the first device and the second device are coupled in width expansion.

18. A multi-port memory device comprising:

first means for receiving first address information;

second means for receiving second address information and write data;

means for storing the write data, the storing means coupled to the first receiving means and the second receiving means; and means for invalidating the write data so that the write data is not stored in the storing means, the invalidating means coupled to the first and second receiving means.

19. A system comprising:

a multi-port memory device having:
 a memory cell;
 an undo circuit coupled to the memory cell and staging write data to be written into the memory cell; and
 an invalidation circuit coupled to the undo circuit, wherein:
  in response to a busy signal, the invalidation circuit invalidates the write data staged in the undo circuit so that the write data is not written into the memory cell.

20. A method for invalidating a write operation in a first multi-port memory device having a first port and a second port, the method comprising the steps of:

asserting a first busy signal if the first port is accessing a first memory cell in the first multi-port memory device at substantially the same time that the second port is receiving first write data for the first memory cell; and invalidating the first write data in response to the first busy signal so that the first write data is not written into the memory cell.

21. The method of claim 20, further comprising the step of:

storing the first write data in a write pipeline.

22. The method of claim 20, further comprising the step of:

generating a second busy signal from a second multi-port memory device if a first port of the second multi-port memory device is accessing a second memory cell at substantially the same time that a second port of the second multi-port memory device is receiving second write data, wherein said first and second multi-port memory devices are coupled in width expansion.

23. The method of claim 22, further comprising the step of:

invalidating the first and second write data in response to either the first or second busy signals so that the first and second write data are not written into the first or second memory cells.

* * * * *